(12) United States Patent
Estanislao et al.

(10) Patent No.: US 7,164,588 B2
(45) Date of Patent: Jan. 16, 2007

(54) SNAP-IN PRINTED CIRCUIT BOARD HOLDER

(75) Inventors: Danilo F. Estanislao, Old Bridge, NJ (US); Paul Soccoli, Flushing, NY (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 0 days.

(21) Appl. No.: 11/236,379

(22) Filed: Sep. 27, 2005

(65) Prior Publication Data
US 2006/0133060 A1 Jun. 22, 2006

Related U.S. Application Data

(60) Provisional application No. 60/637,319, filed on Dec. 16, 2004.

(51) Int. Cl.
*H05K 7/14* (2006.01)
*H05K 7/18* (2006.01)

(52) U.S. Cl. ...................... 361/801; 361/802; 206/708; 206/509; 206/518

(58) Field of Classification Search ................ 361/801, 361/206, 708, 802, 752; 29/759, 729, 739
See application file for complete search history.

*Primary Examiner*—Kamand Cuneo
*Assistant Examiner*—Ivan Carpio
(74) *Attorney, Agent, or Firm*—Paul J. Sutton

(57) ABSTRACT

A printed circuit board (PCB) holder having a pair of spaced apart frames with captivating mechanisms for supporting one or more PCBs independent of the number and geometry of the PCBs. Each frame is defined by a ridge member surrounding the periphery of the frame and the ridge member has at least one captivating mechanism to engage a portion of at least one PCB. One frame holds one end of a PCB and the other frame holds the opposite end of the PCB.

3 Claims, 5 Drawing Sheets

US 7,164,588 B2

SNAP-IN PRINTED CIRCUIT BOARD HOLDER

This application claims the benefit of the filing date of a provisional application having Ser. No. 60/637,319 which was filed on Dec. 16, 2004.

BACKGROUND OF THE INVENTION

1. Field of the Invention

The present invention relates to a printed circuit board holder.

2. Description of the Related Art

Printed circuit boards (PCBs) are typically mounted in various housing mechanisms depending on the application. For example, a desktop personal computer provides a mother board with sockets or connectors for mounting PCBs. Some electrical system cabinets have frames with racks for mounting PCBs. However, in some instances, the PCBs cannot be installed in a housing because the geometry or dimensions of the PCBs may not be compatible with the housing. Accordingly, there is a need for a mounting mechanism capable of supporting PCBs independent of the number and geometry of the PCBs.

SUMMARY OF THE INVENTION

The present invention overcomes some of the prior art deficiencies by providing a mounting mechanism capable of holding one or more PCBs independent of the number and geometry of the PCBs. The mounting mechanism is a PCB holder comprising a pair of frames including an upper frame having captivating mechanisms for aligning a top edge of PCBs in a vertical manner relative to the frames and a lower frame having captivating mechanisms for securing the bottom edge of the PCBs to a main board. The PCB holder is not limited to any specific geometry or number of PCBs thereby providing a cost effective mounting mechanism for assembling multiple PCBs into a housing. The PCBs can be accurately positioned while maintaining adequate spacing and alignment between PCBs which result in a compact, neat PCB assembly package. For example, the PCB holder can provide alignment between the external components of a PCB (e.g., switches, light emitting diode (LED) indicators or light pipes) and an external opening of a housing. The PCB holder of the present invention can be used in various applications. For example, the PCB holder can be used with an electrical system for holding PCBs as part of a fluorescent lighting controller. The PCB holder also can be utilized in home automation products requiring multiple PCBs.

In one aspect of the present invention, the PCB holder includes a pair of spaced apart frames each frame being defined by a ridge member surrounding the periphery of the frame. The ridge member has at least one captivating mechanism to engage a portion of at least one PCB. One frame holds one end of a PCB and the other frame holds the opposite end of the PCB. In one embodiment of the present invention, the captivating mechanism can include a captivating device comprising a flexible shaft having a first and second end where the first end extends from at least one ridge member and the second end has a head to engage an indentation on a surface of the at least one PCB. The captivating mechanism also can include at least one slot disposed on at least one ridge member. The slot has a pair of walls forming a channel to receive an edge of the at least one PCB. The frame can have a substantially square shape. The PCB holder can include a pair of spaced apart mounting columns disposed on the bottom surface of at least one ridge member to mount one of the frames to an external surface.

The above stated and other embodiments and advantages of the invention will become more apparent from the following detailed description when taken with the accompanying drawings. It will be understood, however, that the drawings are for the purposes of illustration and are not to be construed as defining the scope or limits of the invention, references being had for the latter purpose to the claims appended hereto.

BRIEF DESCRIPTION OF THE DRAWINGS

Preferred embodiments of the present application are described herein with reference to the drawings in which similar elements are given similar reference characters, wherein.

DETAILED DESCRIPTION OF THE INVENTION

The present invention discloses a PCB holder having a pair of spaced apart frames with captivating mechanisms for aligning and securing PCBs in a vertical manner relative to the frames independent of the number and geometry of the PCBs. One frame holds a top end of a PCB and the other frame holds the bottom end of the PCB.

Figure 1:
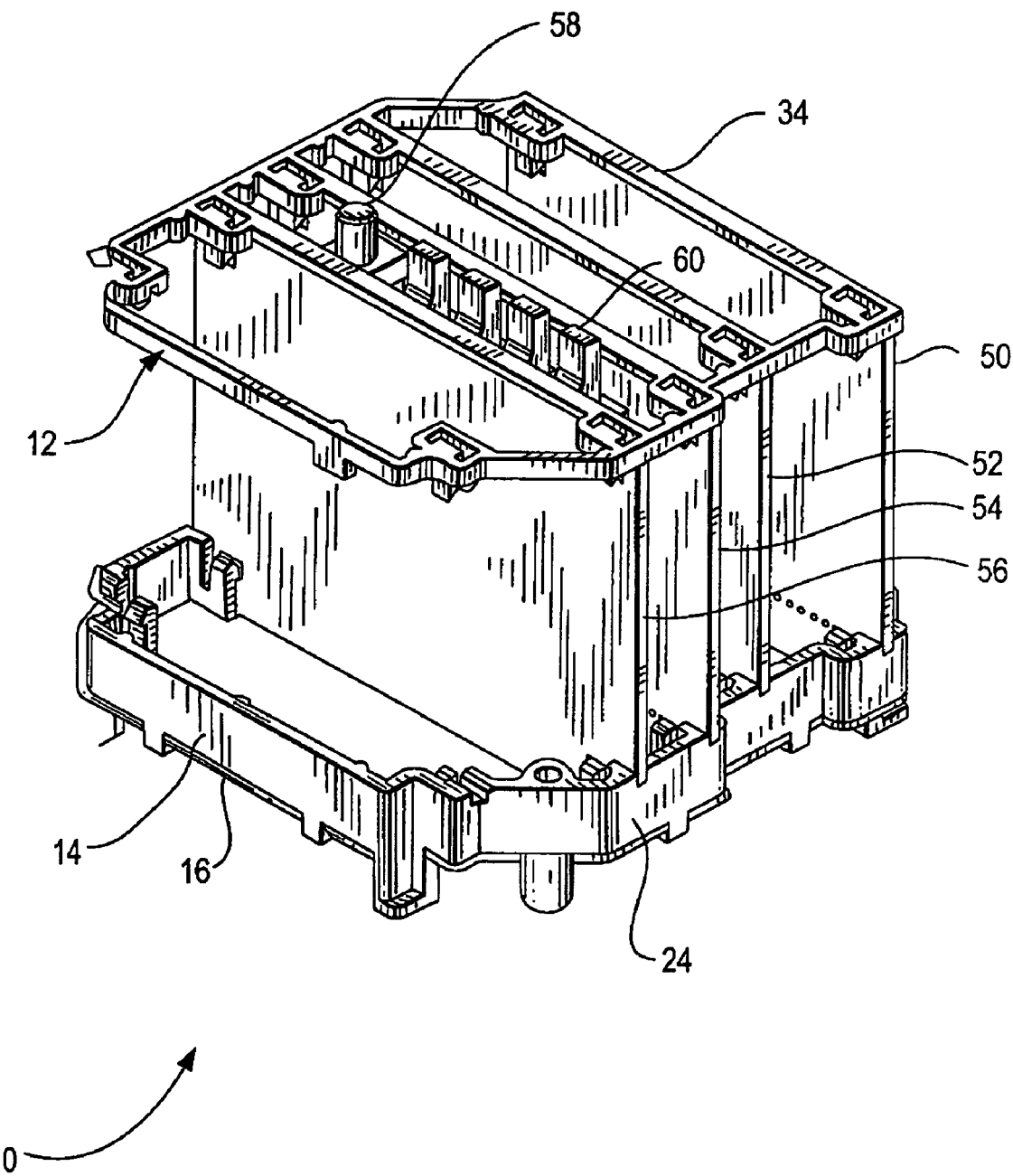
FIG. 1 is a perspective view of a PCB holder assembly according to an embodiment of the invention.
Figure 3:
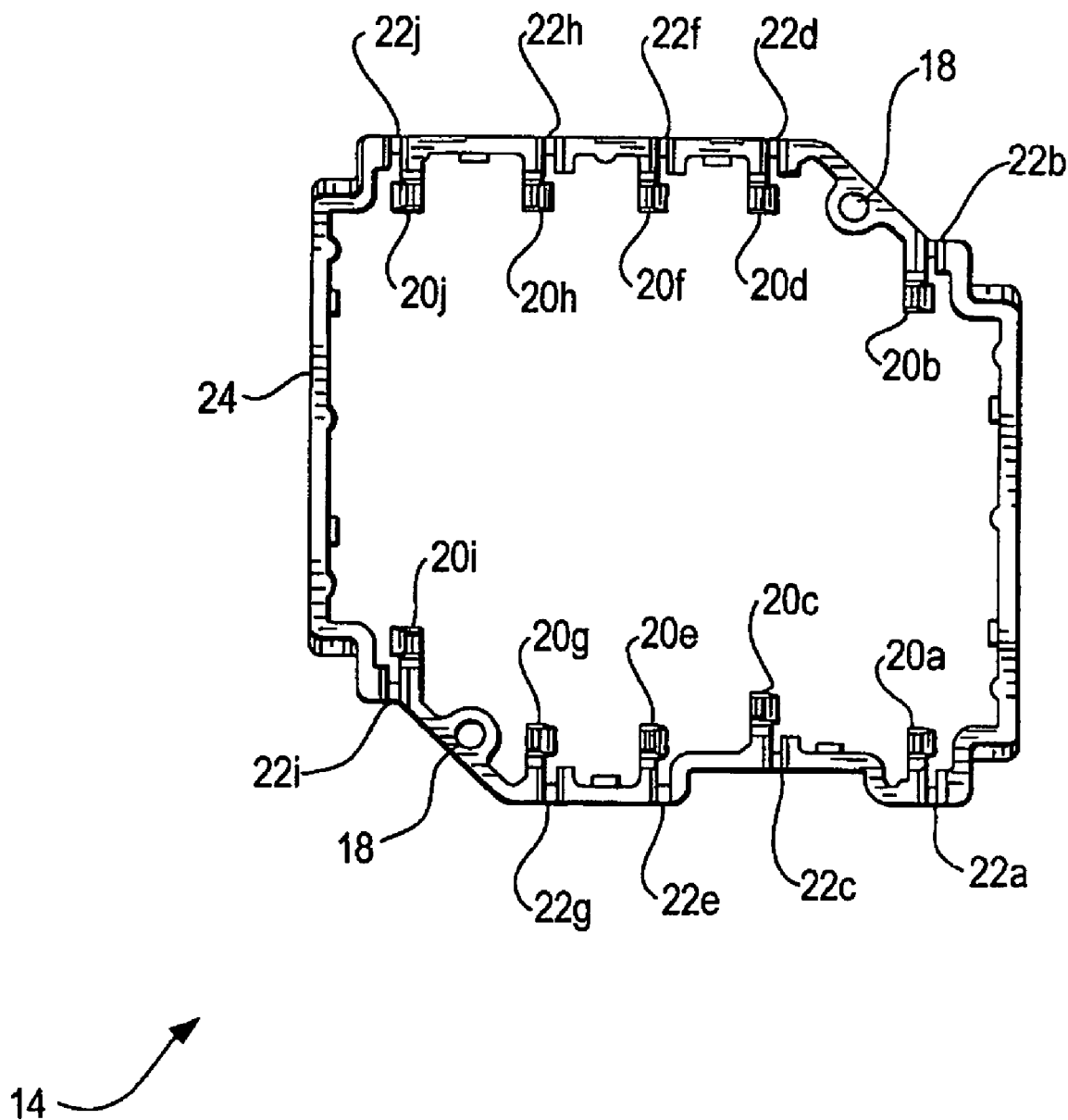
FIG. 3 is a view of the lower PCB holder of the assembly of FIG. 1.
Figure 4:
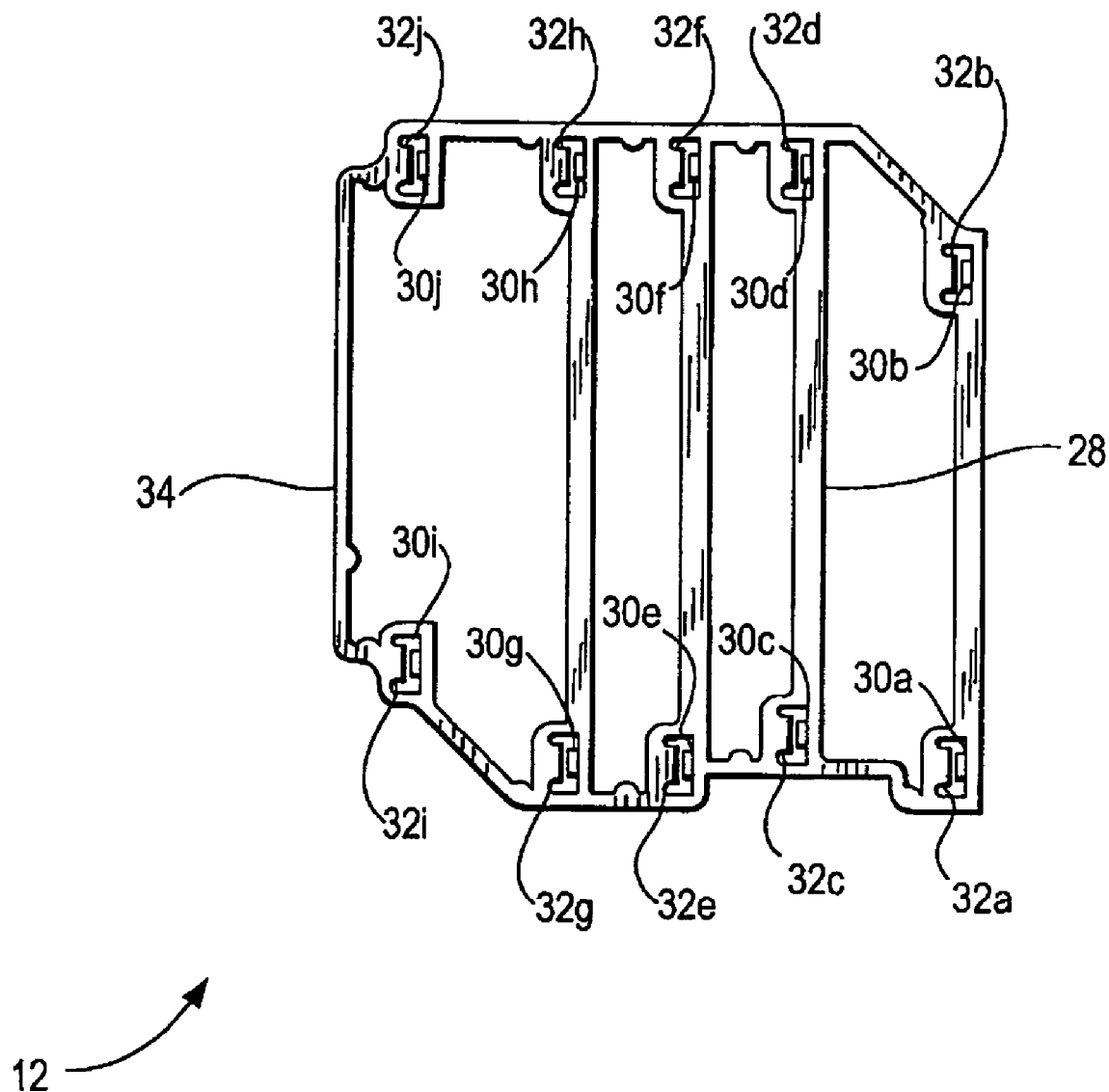
FIG. 4 is a view of the upper PCB holder of the assembly of FIG. 1.

Referring to FIG. 1, there is shown a perspective view of a PCB holder assembly 10 according to an embodiment of the invention. The PCB holder assembly 10 includes an upper frame 12 that supports a top end of PCBs such as PCBs 50, 52, 54, 56 and a lower frame 14 that supports the bottom end of the PCBs. The PCBs are held in perpendicular orientation relative to the plane of the frames 12, 14. It should be noted that the PCBs are shown for illustrative purposes and are not part of the invention. Frames 12, 14 are defined by respective ridge members 34, 24 which surround the periphery of the respective frames. Frames 12, 14 include pairs of captivating mechanisms spaced apart to detachably secure the PCBs. In one embodiment, for example, FIG. 3 shows the lower frame 14 having captivating mechanisms that include captivating devices and/or slots (e.g., captivating device pair 20a, 20b and slot pair 22a, 22b for engaging a lower portion of a PCB) and FIG. 4 shows upper frame 12 having similar upper captivating mechanisms (e.g., captivating device pair 30a, 30b and slot pair 32a, 32b for engaging the upper portion of a PCB). Although the frames 12, 14 are shown as separate structures, a common member can be used for holding the frames 12, 14 together as a single structural unit. The frames 12, 14 can be made of non-conductive material such as plastic, natural or synthetic rubber, thermoset or thermoplastic plastic or the like. The insulating material can serve as an insulator between an external housing (or heat sink) and PCBs mounted on the PCB holder 10. Although the frames shown are capable of supporting 5 (five) PCBs, the techniques of the present invention can be applied for any number of PCBs. Moreover, it should be noted that the captivating mechanisms can be implemented using various combinations of captivating devices and slots.

PCBs can be electrically coupled to each other and to a main board 16 mounted underneath the lower frame 14. The main board 16 can include a motherboard of a controller computer such as a personal computer. The electrical connection can be accomplished using various techniques such as sockets, connectors, straight pin headers, flat ribbon cable or other well known techniques. The PCB holder 10 is capable of vertically aligning PCBs and securing the PCBs to the main board 16 independent of the geometry of the PCBs. PCBs can be accurately positioned while maintaining adequate spacing and alignment between PCBs to provide a compact, neat PCB assembly package. For example, PCB 56 can include components such as a switch 58 and visual indicators 60 such as light emitting diodes (LEDs) or a light pipe. The frames 12, 14 provide improved alignment between the components 58, 60 and corresponding external openings of a housing (not shown). The PCB holder 10 can be employed in various applications. For example, the PCB holder 10 can be used with an electrical system for holding PCBs as part of a fluorescent lighting controller. The PCB holder 10 also can be utilized in home automation products requiring multiple PCBs.

Figure 2:
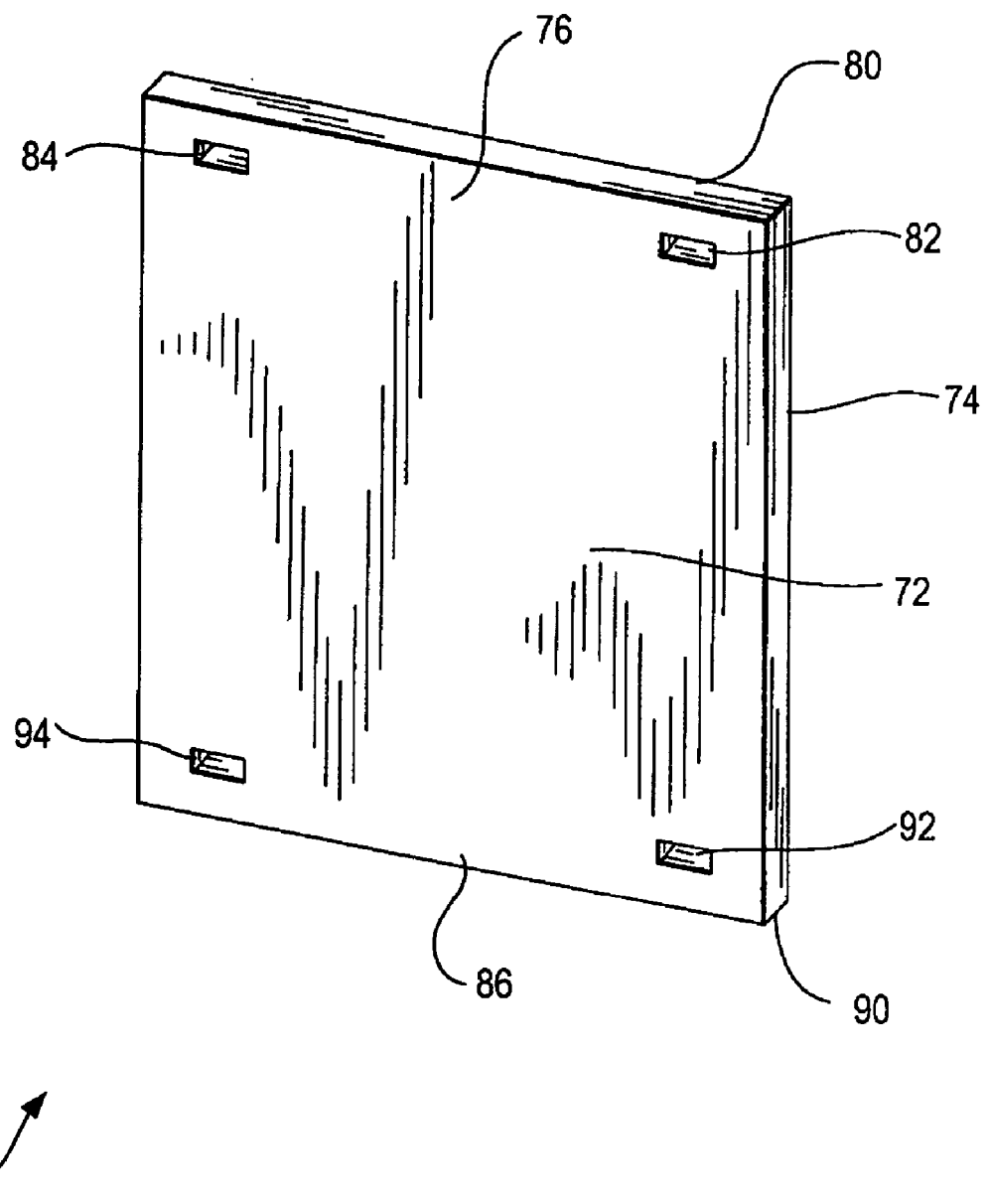
FIG. 2 is a detailed view of a PCB to be used with the PCB holder assembly of FIG. 1.

Referring to FIG. 2, shown is a detailed view of a PCB such as PCB 50 of FIG. 1. As noted above, PCB 50 is not part of the invention and is shown for illustrative purposes. The PCB 50 includes a front surface 72 for holding circuitry and a rear surface 74 for holding conductive trace circuitry. A pair of spaced apart top openings or indentations 82, 84 are located at a top portion 76 adjacent the top edge 80 of the PCB 50. The openings 82, 84 are shaped and aligned for engaging at least a portion of a captivating device pair such as captivating device pair 30a, 30b of the upper frame as shown in FIG. 4. The top edge 80 is used for engaging a slot pair such as slot pair 32a, 32b of the upper frame as shown in FIG. 4. Likewise, a pair of spaced apart bottom openings or indentations 92, 94 are located at a bottom portion 86 adjacent the bottom edge 90 of the PCB 50. The bottom openings 92, 94 are shaped and aligned for engaging at least a portion of a captivating device pair such as captivating device pair 20a, 20b of the lower frame 14 as shown in FIG. 3. The bottom edge 90 is used for engaging a slot pair such as slot pair 22a, 22b of the lower frame as shown in FIG. 3.

Referring to FIG. 3, shown is a detailed view of the lower holder assembly 10 of FIG. 1. In one embodiment, the lower frame 14 supports captivating mechanisms including pairs of captivating devices (20a, 20b), (20c, 20d), (20e, 20f), (20g, 20h), (20i, 20j) and corresponding slots (22a, 22b), (22c, 22d), (22e, 22f), (22g, 22h), (22i, 22j). Each captivating device of a device pair is disposed on opposite portions or segments of the ridge member 24. For example, with respect to device pair 20a, 20b, the first captivating device 20a engages a bottom indentation of a PCB such as the bottom indentation 92 of PCB 50 (See FIG. 2) and the second captivating device 20b engages the bottom indentation 94 of the PCB. Similarly, each of the slots of a slot pair is disposed on opposite portions of the ridge member 24. For example, slots 22a, 22b are used to engage or receive a portion of a bottom edge of a PCB such as the bottom edge 90 of PCB 50 (See FIG. 2). A pair of column members 18 is disposed on opposite corners of the ridge member 24. The members 18 may include an aperture therethrough for accepting a screw or other fastener to provide a means of detachably mounting the lower frame 14 and the PCB assembly 10 to a surface of an external support surface as main board 16 shown in FIG. 1.

Referring to FIG. 4, shown is a detailed view of the upper frame 12 of the PCB holder assembly 10 of FIG. 1. The structure and arrangement of the captivating mechanisms of the upper frame 12 are similar to the captivating mechanisms of the lower frame 14 described above. For example, the upper frame 12 supports pairs of captivating devices (30a, 30b), (30c, 30d), (30e, 30f), (30g, 30h), (30i, 30j) and corresponding slots (32a, 32b), (32c, 32d), (32e, 32f), (32g, 32h), (32i, 32j) for securing the upper portions of PCBs. The frame 12 can be strengthened by employing one or more beam members 28 across opposite portions of the ridge member 34. Since the structure and function of the upper frame 12 is similar to the lower frame 14 as described above, a further description of the upper frame is not provided.

Figure 5:
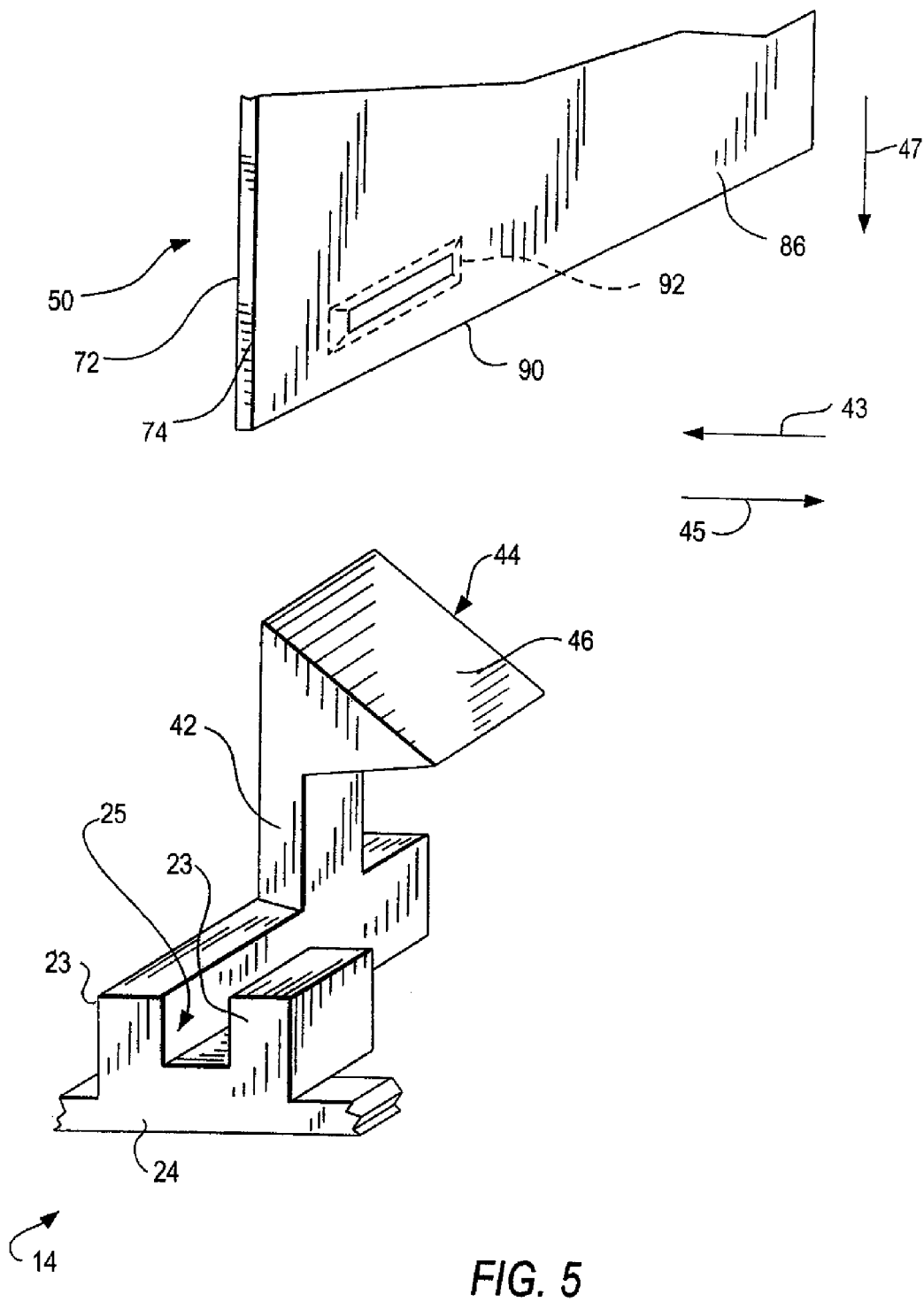
FIG. 5 is a detailed view of the captivating mechanism for holding a PCB to the PCB holder assembly of FIG. 1.

Referring to FIG. 5, shown is a detailed view of the captivating mechanism of the lower frame 14 of FIG. 1. To simplify the discussion, only the interaction between the lower portion of PCB 50 and captivating device 20a and slot 22a is described. But it should be understood that PCB 50 interacts with the pair of lower captivating mechanisms (captivating devices 20a, 20b and slots 22a, 22b) of the lower frame 14 and upper captivating mechanisms (captivating devices 30a, 30b and slots 32a, 32b) of the upper frame 12.

Captivating device 20a includes a flexible shaft 42 having one end attached to The ridge member 24 and the other end attached to a wedge shaped protrusion 44. The protrusion 44 has a top face 46 which is outwardly tapered to deflect The shaft 42 outwardly (shown as arrow 43), for example, when PCB 50 is moved into position (arrow 47), which returns back to its original position (arrow 45) due to the resilience of the material from which the device is made when the PCB is set in position. Channel 25 is defined by a pair of opposite walls 23 having a depth and width sufficient to receive and detachably secure the bottom portion 86 of PCB 50. Although the captivating mechanism has been described in the context of the lower frame 14, it is understood that it is equally applicable to the upper frame 12.

The installation procedure of PCI3 50 onto captivating device (20a, 22a) of the lower frame is now described. As the PCB 50 is advanced toward the lower frame 14, the bottom portion 86 begins to engage the top 46 of the wedge shaped protrusion 44 and urge the top 46 (and shaft 42) outwardly as shown by arrow 43. The PCB 50 is further advanced until the bottom edge 90 contacts the channel 25 which causes a portion of the face 46 to be captured by indentation 92 in the PCB and causes the flexible shaft to return the wedge 44 to its original position (shown by arrow 45) due to the resilience of the captivating device.

Thus, the captivating device mechanism provides a "snap-in" or latch action by capturing the lower portion of PCB 50. Additional PCBs can be mounted to other captivating mechanisms disposed on the lower frame 14 in a similar manner as above. Once the PCBs are secured to the lower frame, the upper frame 12 can be placed over the top portions of the PCBs such as top portion 76 of PCB 50 (See FIGS. 2 and 3). The upper frame 12 functions in a similar manner (e.g., providing a "snap-in" action) as the lower frame and is not described further. Referring to FIG. 1, once the PCBs have been mounted to frames 12, 14, the PCBs can be interconnected to each other as well as to main PCB 16 via the lower frame. In addition to the easy installation of a PCB, the captivating mechanism allows the easy removal of PCB 50.

While there have been shown and described and pointed out the fundamental features of the invention as applied to the preferred embodiment as is presently contemplated for carrying thereout, it will be understood that various omissions and substitutions and changes of the form and details of the device described and illustrated and in its operation may be made by those skilled in the art, without departing from the spirit of the invention.

What is claimed is:

1. A printed circuit board (PCB) holder comprising a pair of spaced apart opposing frames for receiving there between a PCB wherein each frame is defined by a ridge member having opposing segments where each opposing segment of at least one of the ridge members supports a channel to engage a portion of a PCB, and first and second flexible shafts each having a first end coupled to each opposing segment and extending toward the opposing frame, and wedge shape protrusion coupled to a second end of each flexible shaft, wherein the leading edge of said wedge shape protrusion extends over and beyond said channel to engage an indentation on a surface of the PCB.

2. The printed circuit board holder of claim 1, wherein at least one of the frames is substantially square shaped.

3. The holder of claim 1, further comprising a pair of spaced apart mounting columns disposed on at least one ridge member to mount the frames to an external surface.

* * * * *